(12) United States Patent
Tatapudi et al.

(10) Patent No.: US 8,816,738 B2
(45) Date of Patent: Aug. 26, 2014

(54) CONTROLLING SLEW RATE PERFORMANCE ACROSS DIFFERENT OUTPUT DRIVER IMPEDANCES

(75) Inventors: Suryanarayana B. Tatapudi, Boise, ID (US); Jeffrey P. Wright, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1390 days.

(21) Appl. No.: 12/050,876

(22) Filed: Mar. 18, 2008

(65) Prior Publication Data

US 2009/0238012 A1 Sep. 24, 2009

(51) Int. Cl.
*H03K 5/12* (2006.01)
(52) U.S. Cl.
USPC .......................................................... 327/170
(58) Field of Classification Search
USPC .................. 327/108, 109, 112; 326/82, 83, 85
See application file for complete search history.

(56) References Cited

U.S. PATENT DOCUMENTS 5,587,674 A * 12/1996 Danstrom ........................ 327/67
7,151,700 B2   12/2006 Ba
2008/0303558 A1 * 12/2008 Rho ............................... 327/108

OTHER PUBLICATIONS

U.S. Appl. No. 11/856,352, filed Sep. 17, 2007.

* cited by examiner

*Primary Examiner* — Daniel Rojas
(74) *Attorney, Agent, or Firm* — Fletcher Yoder, P.C.

(57) ABSTRACT

Embodiments are provided including one directed to an output driver system, having an adjustable pre-driver configured to maintain a generally constant slew rate of an output driver across a plurality of output driver impedances. Other embodiments provide a method of operating a memory device, including determining an output driver strength of an output driver and configuring the pre-driver based on the determined output driver strength.

25 Claims, 7 Drawing Sheets

CONTROLLING SLEW RATE PERFORMANCE ACROSS DIFFERENT OUTPUT DRIVER IMPEDANCES

BACKGROUND

1. Field of the Invention

One or more embodiments of the invention relate generally to the field of memory sub-systems and more particularly, to techniques for controlling slew rate performance of an output driver across various output impedances.

2. Description of the Related Art

Processing speeds, system flexibility, and size constraints are typically considered by design engineers tasked with developing computer systems and system components. Computer systems generally include a plurality of memory devices which may be used to store programs and data and which may be accessible to other system components such as processors or peripheral devices. The memory devices, typically, are grouped together to form memory modules such as dual-inline memory modules (DIMMs). Further, computer systems may incorporate numerous memory modules to increase the storage capacity of the system.

Generally, each memory device of a memory module includes one or more output drivers configured to adjust on-die termination and to adjust the output impedance of the memory device. For example, the output impedance of the output driver may be varied based on the output coupled to a data pin of the memory device. In the case of certain memory types, the output impedance may be configured to one of various impedances. Unfortunately, the slew rate (e.g., the maximum rate of change) of signals output by the output driver at one impedance may not be maintained at another output impedance. In other words, the slew rate may fall within an acceptable range when the output driver is configured to one impedance, but the slew rate may undesirably change and even fall out of the acceptable range when the output driver is configured to another impedance.

Embodiments of the present invention may be directed to one or more of the problems set forth above.

DETAILED DESCRIPTION OF SPECIFIC EMBODIMENTS

As discussed in further detail below, the disclosed systems and methods relate to a system for dynamically and/or selectably configuring (e.g., setting, adjusting, etc.) an output driver to maintain a generally constant slew rate regardless of the output impedance configuration, for example. More specifically, in certain embodiments, the disclosed systems and methods include a pre-driver that can be configured to one or more states based on the output impedance of the output driver. The one or more states may enable the output driver to maintain a generally constant slew regardless of the output impedance configuration. Before a detailed discussion of the systems and methods in accordance with various embodiments of the present invention, it may be beneficial to discuss embodiments of memory devices that may incorporate the devices described.

Figure 1:
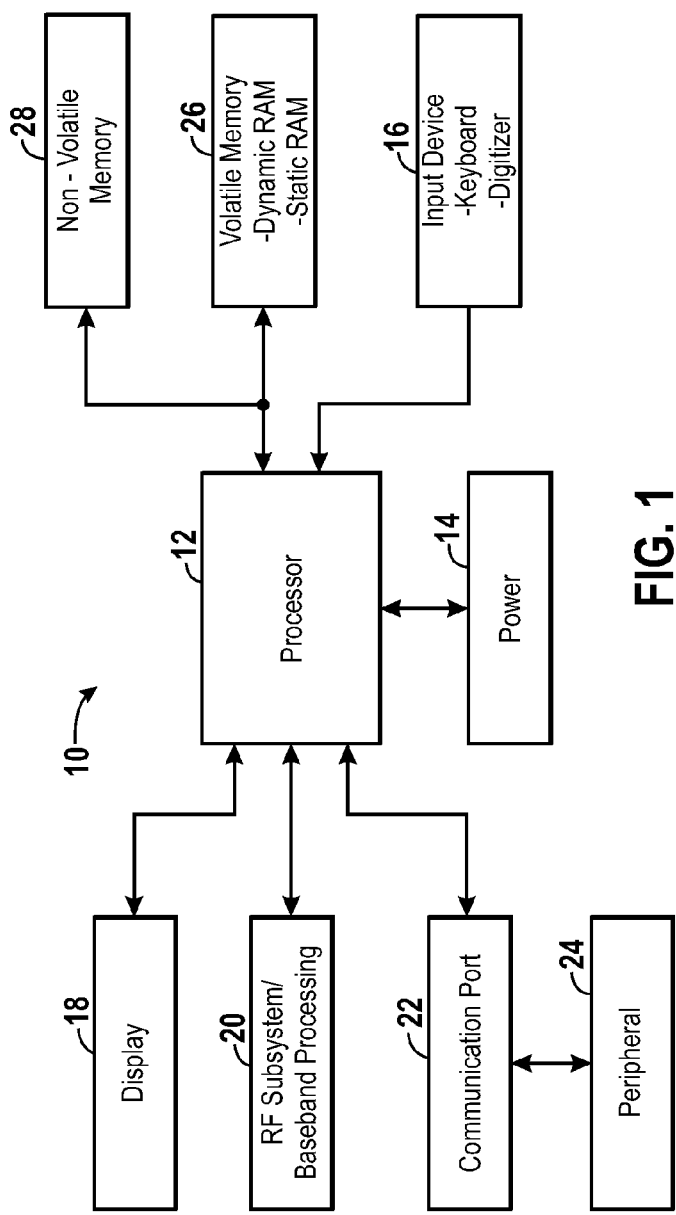
FIG. 1 is a block diagram that illustrates a processor based system in accordance with one or more embodiments of the present invention.

Turning now to the figures, FIG. 1 is a block diagram that depicts a processor-based system, generally designated by reference numeral 10. The system 10 may be any of a variety of types such as a computer, pager, cellular phone, personal organizer, control circuit, etc. In a typical processor-based system, one or more processors 12, such as a microprocessor, control the processing of system functions and requests in the system 10.

The system 10 typically includes a number of components. For example, the system 10 includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 is typically large so that it can store dynamically loaded applications and data. As described further below, the volatile memory 26 may be configured in accordance with embodiments of the present invention.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
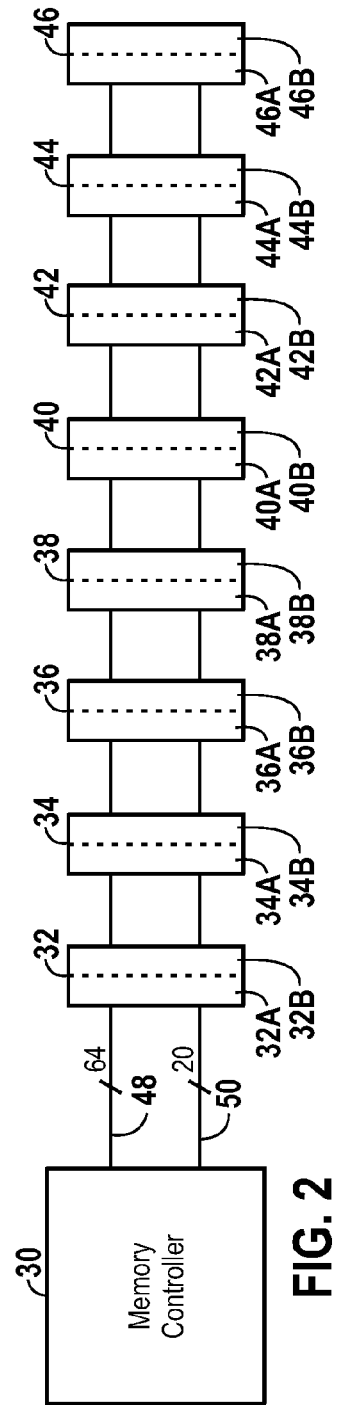
FIG. 2 is a block diagram that illustrates a memory sub-system in accordance with one or more embodiments of the present invention.

FIG. 2 generally illustrates a block diagram of a portion of a memory sub-system, such as the volatile memory 26. A memory controller 30 is generally provided to facilitate access to storage devices in the volatile memory. The memory controller 30 may receive requests to access the storage devices via one or more processors, such as the processor 12, via peripheral devices, such as the peripheral device 24, and/or via other systems. The memory controller 30 is generally tasked with facilitating the execution of the requests to the storage devices and coordinating the exchange of information, including configuration information, to and from the memory devices.

The memory sub-system may include a plurality of slots 32-46. Each slot 32-46 is configured to operably couple a memory module, such as a dual-inline memory module (DIMM), to the memory controller 30 via one or more memory buses. Each DIMM generally includes a plurality of memory devices such as dynamic random access memory (DRAM) devices capable of storing data, as described further below with reference to FIG. 3. Each DIMM has a number of memory devices on each side of the module. Each side of the module may be referred to as a "rank." Accordingly, each slot 32-46 is configured to receive a single DIMM having two ranks. For instance, the slot 32 is configured to receive a DIMM having ranks 32A and 32B, the slot 34 is configured to receive a DIMM having ranks 34A and 34B, and so forth. In the present embodiment, each of the eight memory slots 32-46 is capable of supporting a module comprising eight individual memory devices on each rank 32A/B-46A/B, as best illustrated with respect to FIG. 3, described further below.

Referring again to FIG. 2, the memory buses may include a memory data bus 48 to facilitate the exchange of data between each memory device on the DIMMs and the memory controller 30. The memory data bus 48 comprises a plurality of single bit data buses (e.g., line DQ illustrated in FIG. 4) each coupled from the memory controller 30 to a memory device. As will be described further below with respect to FIGS. 3 and 4, the data bus 48 may also include output drivers that can modify signals routed through a memory module, such as data signals traveling across the data bus 48, such they can be transmitted to and/or interpreted by an output coupled to the memory data bus 48 and/or the memory module. For example, the output driver can be configured to regulate the impedance of signals transmitted on the data bus, as is discussed in further detail below with regard to FIG. 4. In one embodiment of the volatile memory 26, the memory data bus 48 may include 64 or more individual data buses. Further, the memory data bus 48 may include one or more individual buses to each memory rank 32A/B-48A/B which may be used for ECC error detection and correction. As can be appreciated by those skilled in the art, the individual buses of the memory data bus 48 will vary depending on the configuration and capabilities of the system 10.

The volatile memory 26 also includes a command bus 50 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described with reference to the memory data bus 48, a variety of embodiments may be implemented for the command bus 50 depending on the system configuration.

Figure 3:
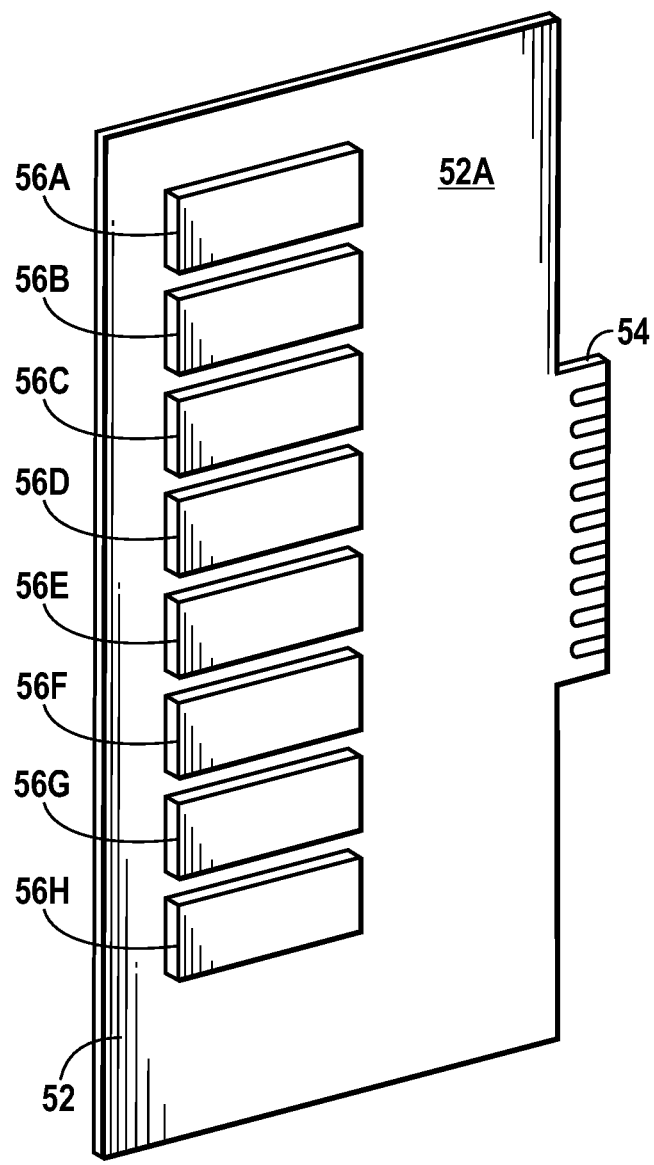
FIG. 3 is a block diagram that illustrates a memory module in accordance with one or more embodiments of the present invention.

FIG. 3 illustrates a memory module 52, such as a DIMM, that may be inserted into one of the memory slots 32-46 (FIG. 2). In the present view, one side of the memory module 52 is illustrated, and generally designated as the rank 52A. As previously discussed, the memory module 52 may include two ranks 52A and 52B. The rank 52A includes a plurality of memory devices 56A-56H, such as synchronized dynamic random access (SDRAMs), which may be used for storing information. As will be appreciated, the second opposing side of the memory module 52 (52B, not shown) also includes a number of memory devices. The memory module 52 may include an edge connector 54 to facilitate mechanical coupling of the memory module 52 into one of the memory slots 32-46. Further, the edge connector 54 provides a mechanism for electrical coupling to facilitate the exchange of data and control signals from the memory controller 30 to the memory devices 56A-56H (and the memory devices on the second rank) on the memory module 52.

As discussed briefly above and discussed in further detail below with regard to FIG. 4, an output driver may be provided and may include an electrical circuit configured to modify signals routed within the memory module 52 such that they can be transmitted to and/or interpreted by an output coupled to the memory data bus 48 and/or the memory module 52. For example, an output driver may be responsible for outputting digital signals including high and low voltage levels that relate to data being transmitted across the memory data bus 48. Thus, the output driver may be configured to pass data and other signals at rate in accordance with a clock speed of the system. As may be appreciated, transmitting data, especially at high speeds, may require additional considerations to ensure that electrical signals are properly transmitted (e.g., the transmitted signals maintain a level of signal integrity that ensures the signals are indicative of certain events and data values). Accordingly, maintaining signal integrity may become increasingly more difficult as the throughput of data and, thus, the clock speed of the system increases. Further, maintaining signal integrity may become increasingly more difficult as the voltage swing between high and low voltage levels is decreased. For example, reflections, although not a significant problem in double-data-rate two synchronous dynamic random access memory (DDR2 SDRAM), may be more of a concern in double-data-rate three synchronous dynamic random access memory (DDR3 SDRAM) that operates at higher clock speeds and that has a limited output swing (e.g., a reduced voltage swing between high and low states).

Figure 4:
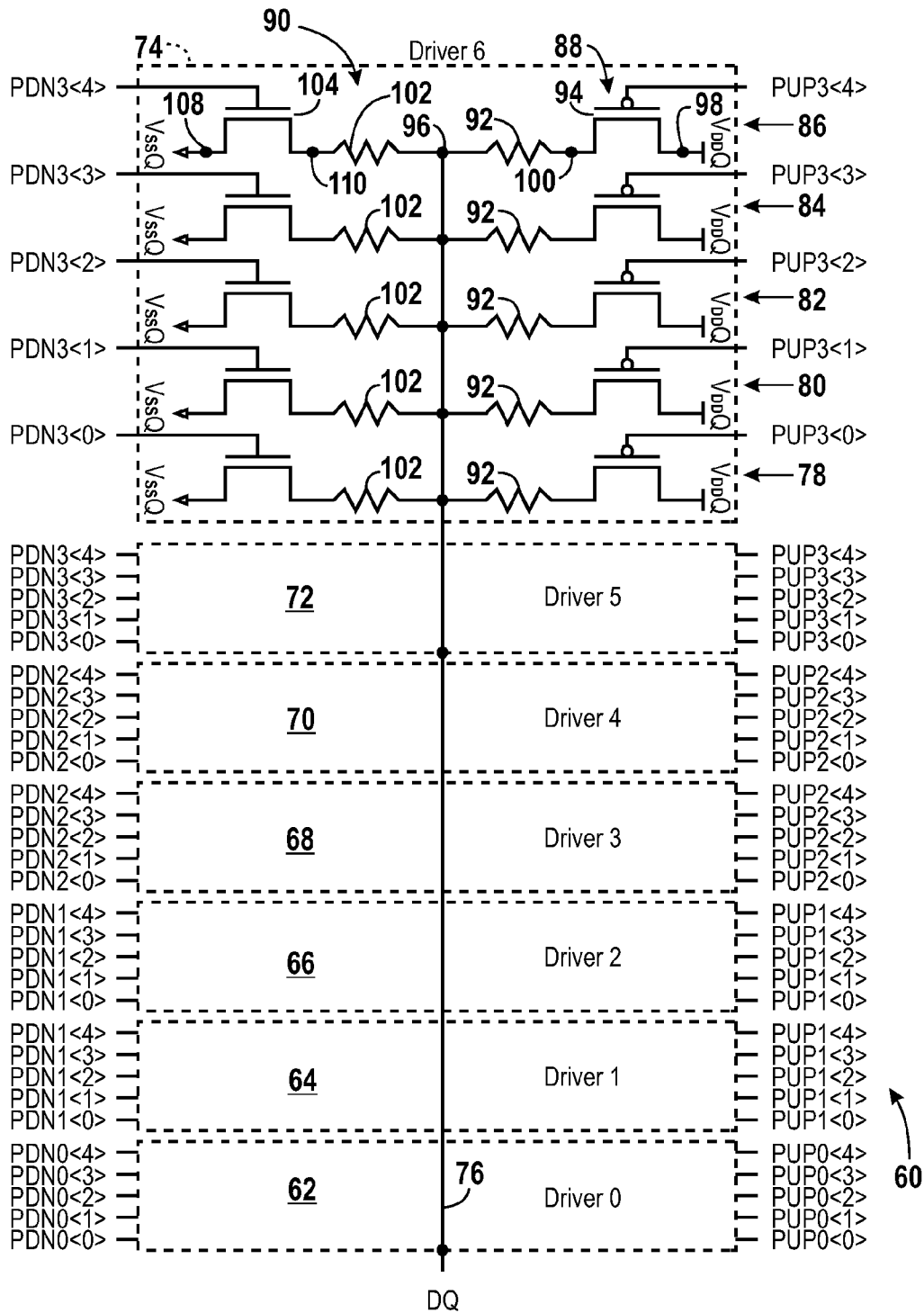
FIG. 4 is schematic diagram that illustrates an output driver in accordance with one or more embodiments of the present invention.

Turning now to FIG. 4, a schematic diagram of an output driver 60 in accordance with an embodiment of the present invention is illustrated. The output driver 60 includes seven driver stages 62, 64, 66, 68, 70, 72, and 74 connected in parallel along a data line 76 that terminates at a data node (driver output) DQ. Generally, each of the driver stages 62-74 may include identical/similar circuitry in certain embodiments. In the illustrated embodiment, the first six driver stages 62, 64, 66, 68, 70, and 72 are represented as blocks, and only the seventh driver stage 74 is depicted in significant detail. The seven driver stages 62-74 are grouped as driver 6 and driver 5, driver 4 and driver 3, driver 2 and driver 1, and driver 0. The grouping is reflected by the signals PUP3<4:0>, PUP2<4:0>, PUP1<4:0>, PDN3<4:0>, PDN2<4:0>, and PDN1<4:0> shared between the driver stages 62-74. PUP3<4:0>, PUP2<4:0>, and PUP1<4:0> signals each drive two driver stages. For example, PUP3<4:0> drives the two driver stages 72 and 74. PUP0<4:0> drives only one driver stage, driver stage 62. The pull down signals PDN3<4:0>, PDN2<4:0>, PDN1<4:0>, and PDN0<4:0> have a similar configuration.

As is illustrated by the detail of the seventh driver stage 74, each of the driver stages 62-74 includes five driver circuits 78, 80, 82, 84 and 86 that each includes a pull-up leg 88 and a pull-down leg 90. The pull-up leg 88 includes a fixed (e.g., passive) resistor 92 coupled in series with a variable transistor 94. As illustrated, the fixed resistor 92 is coupled between the variable transistor 94 and a node 96 of the data line 76. In one embodiment, the fixed resistor 92 may include a polyresistor and the variable transistor 94 may include a PMOS device. A first node 98 of the transistor 94 is coupled to a first power supply (VddQ) and a second node 100 is coupled to the fixed resistor 92. Pull-up signals (PUP3<4:0>) are input to each gate of the five transistors 94, respectively. Each of the driver stages 62-74 include similar pull-up signals (PUP0<4:0>, PUP1<4:0>, PUP2<4:0>, and PUP3<4:0>) that are input to each of the driver stages 62-74 and their corresponding driver circuits. Although not depicted in FIG. 4, each of the pull-up signals (PUP0<4:0>, PUP1<4:0>, PUP2<4:0>, and PUP3<4:0>) may have been modified by additional circuitry, such as a pre-pre-driver stage and/or a pre-driver stage, as discussed in greater detail below with regard to FIG. 5. This may provide appropriate conditioning and/or calibration of the pull-up signals (PUP0<4:0>, PUP1<4:0>, PUP2<4:0>, and PUP3<4:0>) input to the variable transistor 94.

Similar to the pull-up leg 88, the pull-down leg 90 includes a fixed (e.g., passive) resistor 102 coupled in series with a variable transistor 104. As illustrated, the fixed resistor 102 is coupled between the variable transistor 104 and the node 96 of the data line 76. In one embodiment, the fixed resistor 102 may include a polyresistor and the variable transistor 104 may include an NMOS device. A first node 108 of the transistor 104 is coupled to a second power supply (VssQ) and a second node 110 is coupled to the fixed resistor 102. Pull-down signals (PDN0<4:0>) are input to each gate of the five transistors 104, respectively. Each of the driver stages 62-74 include similar pull-down signals (PDN1<4:0>, PDN2<4:0>, and PDN3<4:0>) that are input to each of the driver stages 62-74 and their corresponding driver circuits. Similar to the pull-up leg 88, although not depicted in FIG. 4, each of the pull-down signals (PDN0<4:0>, PDN1<4:0>, PDN2<4:0>, and PDN3<4:0>) may have been modified by additional circuitry, such as a pre-pre-driver stage and/or a pre-driver stage, as discussed in greater detail below with regard to FIG. 5. This may provide appropriate conditioning and/or calibration of the pull-down signals (PDN0<4:0>, PDN1<4:0>, PDN2<4:0>, and PDN3<4:0>) input to the variable transistor 104.

The output driver 60 can be characterized by output driver strength (ODS) when the driver 60 is driving the external bus and on-die termination (ODT) when providing line termination. ODS settings may include 34 ohm, 40 ohm and 48 ohm, the total resistance of the pull-up legs 88 and the pull-down legs 90. In operation, each driver stages 62-74 may be configured to have a fixed resistance, such as 240 ohms. The resistance may be is attributable to the pull-up legs 88 combined in parallel giving a resistance of 240 ohms and the pull-down legs 90 combined in parallel giving a resistance of 240 ohms. Due to process, voltage, and temperature (PVT) variations, each driver stage 62-74 may not have the desired fixed resistance. Accordingly, each driver stage 62-74 may be calibrated by a calibration circuit (not shown). For example, in the illustrated embodiment, the calibration circuit may regulate a signal to the gate of a trim transistor (discussed in greater detail below with regard to FIG. 5) that regulates each pull-up signal (PUP) and/or each pull-down signal (PDN) to configure the pull-up legs 88 to the desired resistance (e.g., 240 ohms) and the pull-down legs 90 to the desired resistance (e.g., 240 ohms). It may be noted that one of the driver circuits 78-86 in each driver stage 62-74 may remain enabled. For example, in the embodiment illustrated in FIG. 4, PUP<m>4 and PDN<m>4 are always enabled, thereby, enabling the variable transistors 94 and 104 of the fifth driver circuit 86 of the driver stage 74. To configure the driver stage 74 to have an effective pull-up and pull-down resistance of 240 ohms, the additional devices (e.g., the other driver circuits 78, 80, 82, 84) can be enabled or disabled by the corresponding pull-up and pull-down signals (PUP3<3:0> and PDN3<3:0>) to achieve the desired resistance. Each of the other six driver stages 62, 64, 66, 68, 70, and 72 operate in a similar manner. Although the previously discussed embodiment is one possible implementation of the output driver 60, other embodiments of the output driver 60 may employ the embodiments of the pre-driver.

Figure 5:
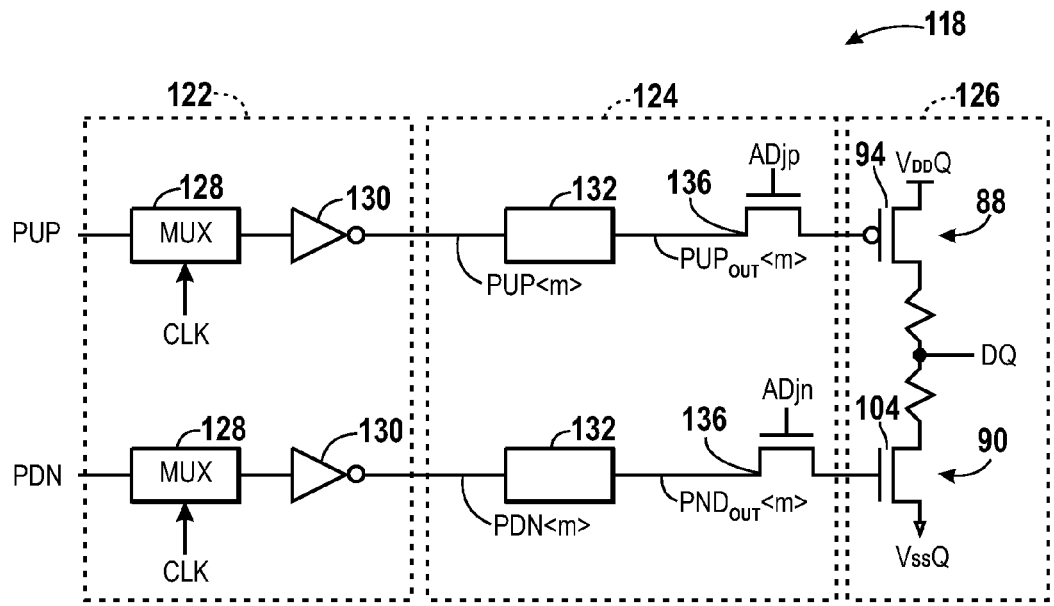
FIG. 5 is schematic diagram that illustrates a single driver circuit of the output driver in accordance with one or more embodiments of the present invention.

FIG. 5 is a schematic diagram that illustrates a single driver circuit 118 of the output driver 60 in detail. The driver circuit 118 depicted includes a pre-pre-driver stage 122, a pre-driver stage 124, and a driver circuit 126, mentioned above. The driver circuit 118 is similar to the depicted driver circuit 78-86 of the driver stages 62-74, however, FIG. 5 also depicts the corresponding pre-pre-driver stage 122 and the corresponding pre-driver stage 124, that are not depicted in FIG. 4. As depicted, each of the incoming signals (PUP and/or PDN) is passed through the pre-pre-driver stage 122 and the pre-driver stage 124 before being transmitted into the driver stage 126. The pre-pre-driver stage 122 generally includes a circuit configured to buffer incoming data signals prior to transmitting them to the pre-driver stage 124. For example, in the illustrated embodiment, the pre-pre-driver stage 122 include multiplexers 128 that receive the incoming pull-up (PUP) and/or pull-down (PDN) signals and clock signals (CLK), and that transmit a corresponding signal to inverters 130. The signal output from the inverters 130 of the pre-pre-driver stage 122 is transmitted to the pre-driver stage 124. The pre-driver stage 124 may include pre-driver circuits 132 that modify the incoming signals before they are passed to the driver stage 126 such that the signals correspond to the currently selected output impedance of the output driver 60 and are configured to maintain the slew rate of the output driver at an generally constant level. The details of the pre-driver circuit 132 will be discussed in further detail with regard to FIG.6. After passing through the pre-driver stage 124, the signals are passed through the trim transistors 136. The trim transistors 136 include inputs signals ADjp and ADjn that are varied to provide an overall resistance, such as 240 ohms, for the output driver 60. The input signals ADjp and ADjn are controlled by a separate calibration circuit that generally accounts for process, voltage and temperature variations. The signal output from the trim transistors 136 is routed to the gates of the variable transistors 94 and 104 of the driver stage 126.

In accordance with the previous discussion, each of the driver stages 62-74 may have fixed resistance, such as a 240 ohm resistance. Thus, when all of the driver stages 62-74 are enabled, the full strength output driver 60 has a given output impedance. In an embodiment that includes enabling all of the driver stages 62-74 with each driver stages 64-74 having a 240 ohm resistance, the output impedance of the output driver 60 may be about 34 ohms (approximately 240 ohms/7 drivers), for instance. Generally, the output driver 60 is configured to a 34 ohm output impedance, and, thus, the default configuration (e.g., setting) typically includes enabling all of the driver stages 62-74. Disabling one or more of the driver stages 62-74 may provide for other output impedances. For example, where six of seven of the driver stages 62-74 are enabled the full strength output driver 60 may have an output impedance of about 40 ohms (240 ohms/6 drivers). Similarly, where five of the seven driver stages 62-74 are enabled the full strength output driver 60 may have an output impedance of about 48 ohms (240 ohms/5 drivers).

Accordingly, the output driver 60 can be configured to one of multiple output impedances. In operation, this may be useful because the output impedance may be configured to match the input impedance of a device or circuit coupled to the output driver 60. Unfortunately, the slew rate (e.g., the maximum rate of change) of signals output by the output driver 60 at one impedance, such as a 34 ohm configuration, may not be maintained generally constant at another output impedance, such as a 40 ohm configuration or a 48 ohm configuration. For example, the slew rate may fall within one range when the output driver 60 is configured to one impedance, but the slew rate may undesirably change (e.g., not be maintained generally constant to the first slew rate) and even fall out of an acceptable range, at another impedance. To account for this, the present embodiment includes additional circuitry that can be configured to maintain a generally constant slew rate at each of the output impedance configurations. In certain embodiments discussed below, the pre-driver stage 124 may be configured to account for the variations in the output impedance. More specifically, the pre-driver circuit 132 may include circuitry that can be configured to multiple states that are selected based on the output impedance of the output driver 60. By taking the output impedance into account in accordance with one or more embodiments of the invention, the pre-driver stage 124 may enable the output driver 60 to maintain a slew rate of the output signal that is generally constant (e.g., within 10% of one another) and/or that falls within acceptable range (e.g., 3-5 volts per nanosecond (V/ns)). As will be appreciated by those of ordinary skill in the art, although a defined range, such as 3-5 V/ns may be acceptable, maintaining the slew rate at a generally constant level may further ensure consistent and improved performance of the system. For example, as discussed in further detail below with regard to FIGS. 8-10B, one or more of the present embodiments may maintain the slew rate within about 10% of one another.

To achieve a generally constant slew rate, the present embodiments include determining the present and/or desired output impedance of the output driver 60 and configuring the pre-driver 124 based on the output impedance. Configuring the pre-driver 124 helps to account for changes in the electrical characteristics of the output driver 60 at the various output impedances, thereby, helping to ensure the slew rate is maintained. In certain embodiments, the pre-driver circuit includes control signals that are employed to configure the pre-driver 124. For example, in some of the embodiments discussed below, the pre-driver 124 includes four common control signals that are set to either a high or low state based on the output impedance. Accordingly, in one embodiment, a controller or similar device determines the output driver impedance and configures each of the control signals to one of the states based on the output impedance. When the control signals are set to the corresponding states and the output driver is set to the corresponding output impedance, the pre-driver 124 essentially adjust electrical characteristics of the output driver 60 such that the slew rate at one output impedance is similar to the slew rate of the output driver 60 at another output impedance. In other words, the pre-driver 124 is configured to a state that may prevent the slew rate from changing significantly as the output impedance changes.

Figure 6:
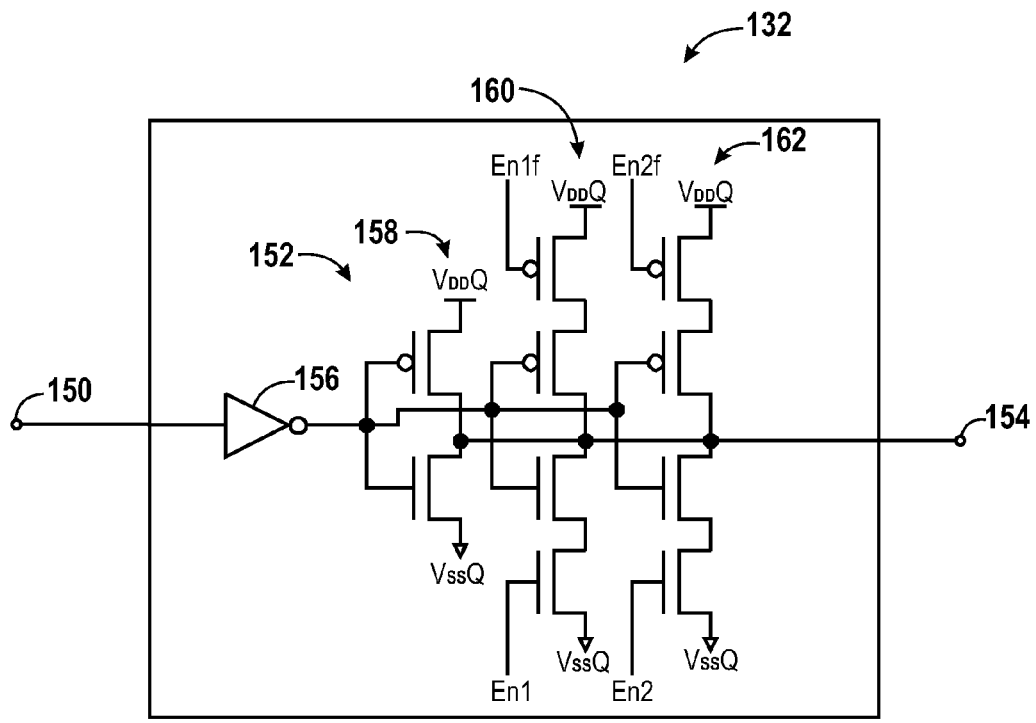
FIG. 6 is schematic diagram that illustrates a pre-driver circuit in accordance with one or more embodiments of the present invention.

Turning now to FIG. 6, an embodiment of the pre-driver circuit 132 in accordance with embodiments of the present technique is illustrated. The pre-driver circuit 132 includes an input node 150, circuitry 152, control inputs (En1, En2, En1f, and En2f), and an output node 154. As discussed previously with regard to FIG. 5, in one embodiment, the pre-driver circuit 132 may receive at the input node 150 a pull-up signal (PUP<m>) and/or pull-down signal (PDN<m>) from an output of the pre-pre-driver stage 122, and may output from the output node 154, a modified pull-up signal (PUPout<m>) and/or pull-down signal (PDNout<m>) to the driver stage 126.

As illustrated, the circuitry 152 includes an inverter 156 having an output coupled in parallel to the gates of a first CMOS inverter 158, a second CMOS inverter 160, and a third CMOS inverter 162. The first CMOS inverter 158 includes one PMOS transistor and one NMOS transistor coupled in series between VddQ and VssQ power supply inputs, respectively. The second CMOS inverter 160 includes a pair of PMOS transistors and a pair of NMOS transistors that are coupled to VddQ and VssQ power supply inputs, respectively. The output of the inverter 156 is coupled to the gates of the internal PMOS and NMOS transistors, and the controls signals (Enf1 and En1) are coupled to the PMOS transistor coupled to VddQ and the NMOS transistor coupled to VssQ, respectively. Similarly, the third CMOS inverter 162 includes a pair of PMOS transistors and a pair of NMOS transistors that are coupled to VddQ and VssQ power supply inputs, respectively. The output of the inverter 156 is coupled to the gates of the internal PMOS and NMOS transistors, and the controls signals (Enf2 and En2) are coupled to the gates of the PMOS transistor coupled to VddQ and the NMOS transistor coupled to VssQ, respectively. The outputs of each of the CMOS inverters 158, 160, and 162 are coupled in parallel to the output node 154. Although a specific embodiment of the pre-driver circuit 132 has been discussed, it will be appreciated that other configurations may provide the same or similar function.

In one embodiment, the pre-driver 132 may be configurable between a plurality of states, wherein selecting one of the plurality of states may be achieved by selectively enabling/disabling one or more of the control signals (En1, En2, En1f, and En2f). For example, the control signals (En1, En2, En1f, and En2f) may be enabled/disabled to select a configuration (e.g., state) of the pre-driver circuit 132 that is preferable for the current configuration (e.g., output impedance) of the output driver 60. Enabling/disabling the control signals (En1, En2, En1f, and En2f) based on the output impedance may be conducive to the output driver 60 to employing various output impedances while maintaining a generally constant slew rate at each of the output impedances. Table 1 is a truth-table that relates the state of the four control signals ((En1, En2, En1f, and En2f) and the output impedance of the output driver 60, in one embodiment of the pre-driver circuit 132.

TABLE 1

| Control Signal | State at 34 ohm Output Impedance | State at 40 ohm Output Impedance | State at 48 ohm Output Impedance |
|---|---|---|---|
| En1 | False | True | True |
| En2 | False | False | True |

TABLE 1-continued

| Control Signal | State at 34 ohm Output Impedance | State at 40 ohm Output Impedance | State at 48 ohm Output Impedance |
|---|---|---|---|
| En1f | True | False | False |
| En2f | True | True | False |

In a first configuration, for example, where the output impedance of the output driver 60 is set to about 34 ohms (e.g., where all of the driver stages 62-74 are enabled), the first enable signal (En1) and the second enable signal (En2) are false and the third enable signal (En1f) and the fourth enable signal (En2f) are true (the inverse of the first and second enable signals, respectively). In a second configuration, for example, where the output impedance of the output driver 60 is about 40 ohms (e.g., where six of seven of the driver stages 62-74 are enabled (e.g., where the driver stage 62 is disabled)), the first enable signal (En1) is true and the second enable signal (En2) is false. The third enable signal (En1f) is false and the fourth enable signal (En2f) is true (the inverse of the first and second enable signals, respectively). In a third configuration, where the output impedance of the output driver 60 is about 48 ohms (e.g., where five of the seven driver stages 62-74 are enabled (e.g., where driver stages 64 and 66 are disabled)), the first enable signal (En1) and the second enable signal (En2) are true and the third enable signal (En1f) and the fourth enable signal (En2f) are false (the inverse of the first and second enable signals, respectively). Such a truth table may be predetermined and/or stored and retrieved form a storage location in one embodiment.

In some configurations, each of the pre-driver circuits 132 may share similar and/or the same control signals (En1, En2, En1f, and En2f). For example, in one embodiment each of the pre-driver circuits 132 of the pull-up legs 88 may share the same enable signals (En1, En2, En1f, and En2f) in parallel and/or each of the pre-driver circuits 132 of the pull-down legs 90 may share the enable signals (En1, En2, En1f, and En2f) in parallel. In other configurations, the pre-driver circuits 132 may receive signals that are not the same and/or not shared in parallel. For example, in one embodiment, physical limitations may prevent the sharing of signals in parallel between all of the pre-driver circuits 132. In such an embodiment, a separate control signal (En1, En2, En1f, or En2f) (although similar) may be received by less than all of the pre-driver circuits 132. For example, a separate control signal (En1, En2, En1f, or En2f) may be routed to each of the pre-driver circuits 132, and/or a control signal (En1, En2, En1f, or En2f) may be shared by groups of less than all of the pre-driver circuits 132 of the pull-up legs 88 and/or the pull-down legs 90.

Figure 7:
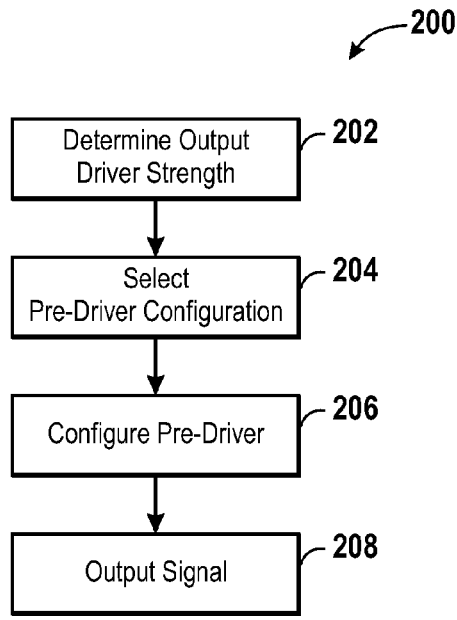
FIG. 7 is a flowchart that illustrates a method in accordance with one or more embodiments of the present invention.

Embodiments of the output driver 60 that employ the pre-driver circuit 132 may include methods of operation and use that enable the pre-driver circuit 132 to be dynamically/selectably configured to account for the current configuration of the output driver 60. For example, turning now to FIG. 7, a flowchart of a method 200 is depicted in accordance with embodiments of the present technique. The method 200 generally includes determining (e.g., detecting) the current configuration of the output driver 60, selecting a configuration of the pre-driver circuit 132, configuring the pre-driver circuit 132, and outputting a signal from the configured pre-driver circuit 132.

For example, the method 200 includes determining the output driver strength, as illustrated at block 202. Determining the output driver strength (block 200) may include determining the current, or soon to be, output impedance of the output driver 60. The output impedance may be determined by actively sensing the output impedance and/or retrieving from a register, or other storage element, information that is indicative of the current or future output impedance. For example, a call in software may query a register or other storage element to determine the current output impedance value (e.g., 34 ohms, 40 ohms, or 48 ohms) and/or a value that the output impedance will be in the near future. Retrieving a future output impedance may be beneficial to the system to aid in coordinating a change in the output impedance with a change of state of the pre-driver circuit 132.

The method 200 also includes selecting a pre-driver configuration, as illustrated at block 204. In one embodiment, selecting a pre-driver configuration (block 204) may include determining which control signals (En1, En2, En1f, and En2f) should be enabled or disabled based on the output driver strength determined at block 202. This may include buffering, in software and/or hardware, the status of each control signal to be employed. For example, where a 34 ohm output impedance is resolved as the current and/or desired output driver strength, selecting the pre-driver configuration may include selecting a configuration wherein the first enable signal (En1) and the second enable signal (En2) are false and the third enable signal (En1f) and the fourth enable signal (En2f) are true, as discussed above. It should be noted that the selection of the pre-driver configuration may be made in software (e.g., by a processor running a routine), hardware (e.g., a set of logic gates), or in a similar location or device that can determine the current strength of the output driver 60 and set the control lines accordingly.

The method 200 also includes configuring the pre-driver, as illustrated at block 206. For example, where selecting the pre-driver configuration (block 204) is accomplished in software, configuring the pre-driver (block 206) may include executing code, functions, or routines to actually set the control signals (En1, En2, En1f, and En2f) to the corresponding enabled or disabled states. Similarly, where selecting the pre-driver configuration (block 204) is accomplished by hardware, configuring the pre-driver (block 206) may include the physical acts of setting the control signals (En1, En2, En1f, and En2f) to the corresponding enabled or disabled states.

The method 200 also includes outputting a signal, as illustrated at block 208. In one embodiment, outputting a signal (block 208) includes outputting a signal from the pre-driver circuit 132 to the driver stage 126 when the control signals (En1, En2, En1f, and En2f) are configured in the corresponding enabled or disabled states. In other words, outputting a signal (block 208) may include passing a signal from the pre-pre-driver stage 122 to the pre-driver circuits 132 of pre-driver stage 124, and outputting a modified signal (e.g., a modified PUP and/or PDN signal) to the corresponding trim transistor 136 of the driver stage 126. Accordingly, outputting the signal (block 208) may include outputting a signal to the driver stage 126 that is based on the output impedance of the output driver 60 and configured to maintain a slew rate of the output driver 60 at the selected output impedance.

Figure 8:
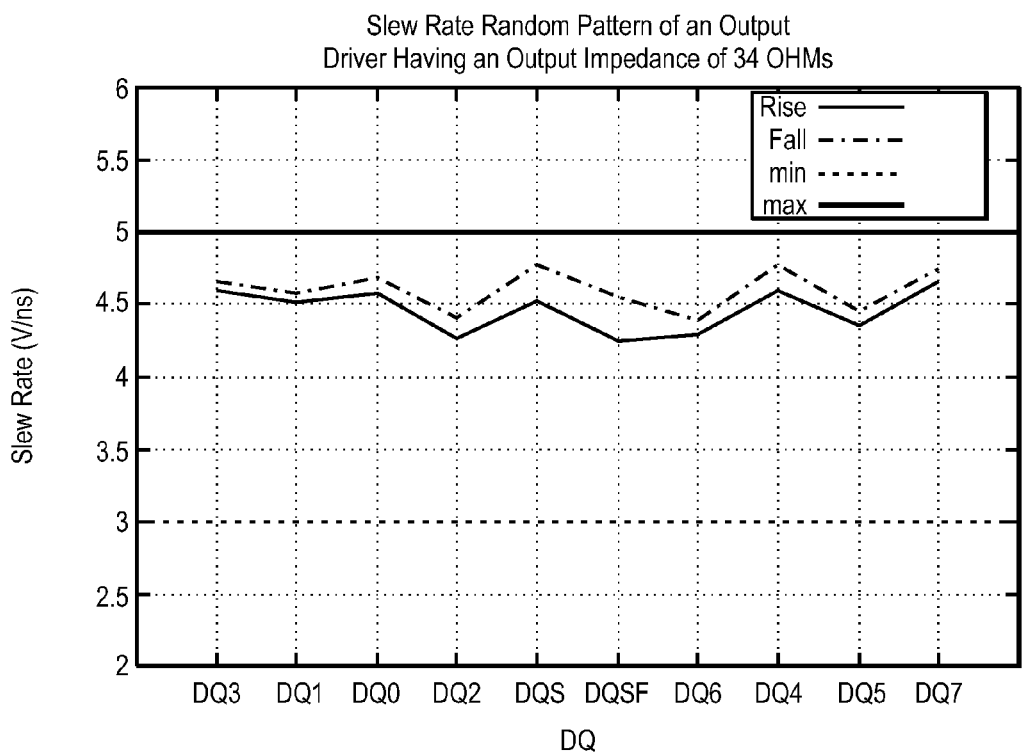
FIGS. 8-10B are a charts that illustrate the slew rate of an output driver in various configurations in accordance with one or more embodiments of the present invention.

Turning now to FIGS. 8-10B, simulated results of output driver systems employing the presently discussed technique, are illustrated. For example, FIG. 8 illustrates the slew rate of a system configured to have a 34 ohm output impedance. It is noted that the slew rate is located in the upper region of an acceptable range (e.g., 3-5 V/ns) and has an approximate average slew rate value of approximately 4.5 V/ns. As will be appreciated, such a system may be designed to have a high slew rate at the 34 ohm output impedance because 34 ohms is typically regarded as a default setting. In other words, where a system is designed around a given output impedance, implementing a pre-driver may not provide a significant advantage at that output impedance, but may prove more useful when the output impedance is varied. Accordingly, increases in the slew rate due to the previously discussed technique may be most notable at output impedances other than the default value of 34 ohms, and the depicted results may be useful to define a baseline for comparing the slew rate at other output impedance settings. For example, the difference between the slew rates of the output driver may be defined as the percentage difference between the slew rate at a first setting (e.g., 34 ohms) and the slew rate at a second output impedance setting (e.g., 40 ohms or 48 ohms). The slew rate of two output impedances may be considered generally constant when the percentage difference between the slew rates is approximately 10% or less. The percentage may be calculated by following equation:

$$\Delta S = \frac{|(S1avg - S2avg)|}{S1avg} * 100 \quad (1)$$

Where $\Delta S$ is the percentage difference between the slew rates, S1avg is an approximate average slew rate at a first output impedance and S2avg is an approximate average slew rate at a second output impedance.

Figure 9A:
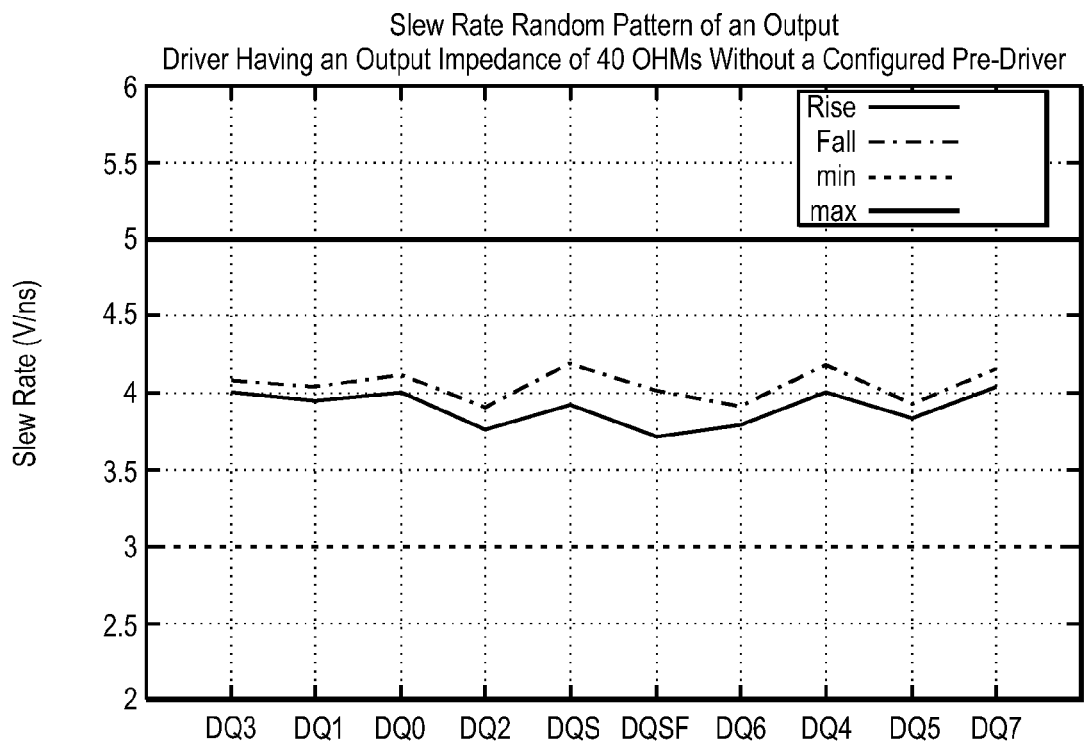
Figure 10A:
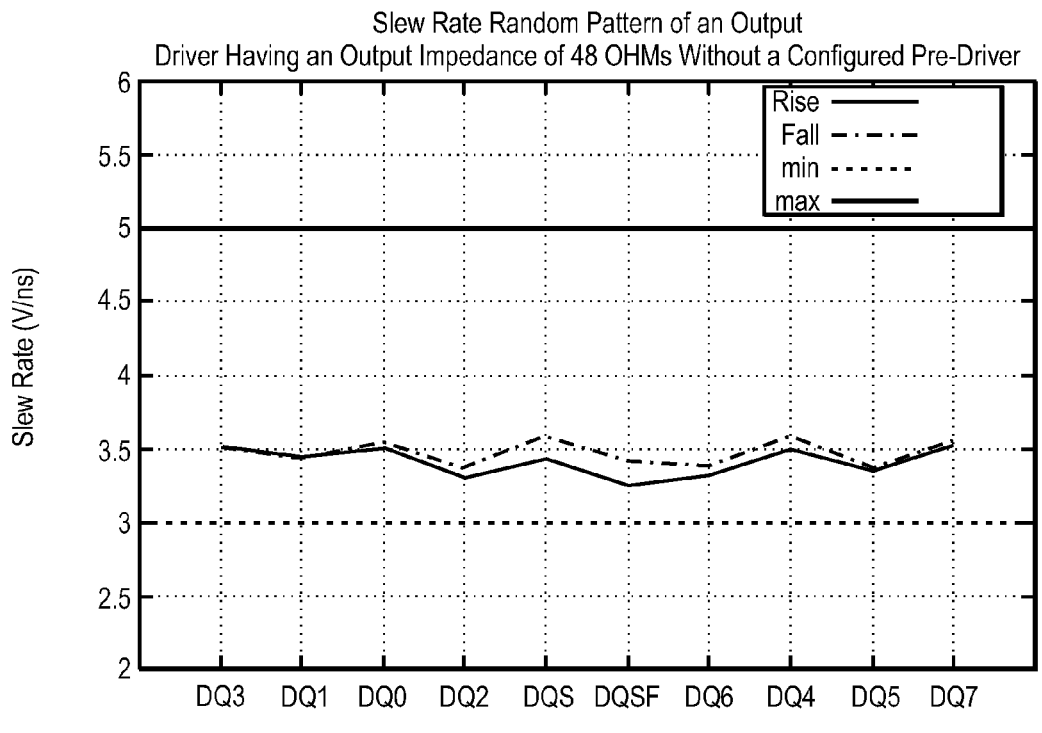

For example, FIGS. 9A and 10A illustrate the slew rate of an output driver 60 at 40 ohms and 48 ohms, respectively, which do not employ a configured pre-driver circuit 132. In other words, the pre-driver circuit 132 is not present in the system and/or not enabled. It is worth noting the slew rate is well below the slew rate of the system including a 34 ohm output impedance, as illustrated in FIG. 8. For example, the slew rate drops to or below 4 V/ns in each configuration, and is near the lower limit of 3 V/ns in the case of a 48 ohm impedance, as illustrated by FIG. 10A. More specifically, in FIG. 9A the average slew rate is approximately 4 V/ns at an output impedance of 40 ohms, and in FIG. 10A the average slew rate is approximately 3.5 V/ns at an output impedance of 48 ohms. In accordance with equation 1, the percentage difference between the slew rates at 34 ohms and 40 ohms is approximately 13% and the difference between the slew rates at 34 ohms and 48 ohms is approximately 25%.

Figure 9B:
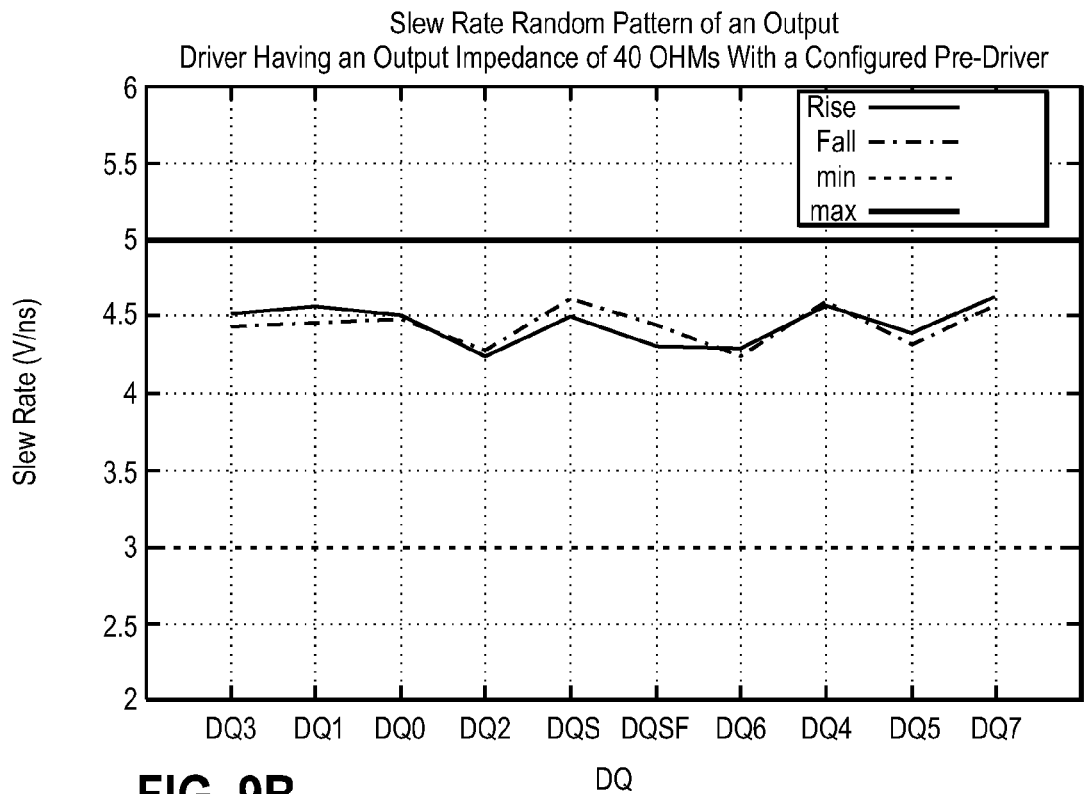
Figure 10B:
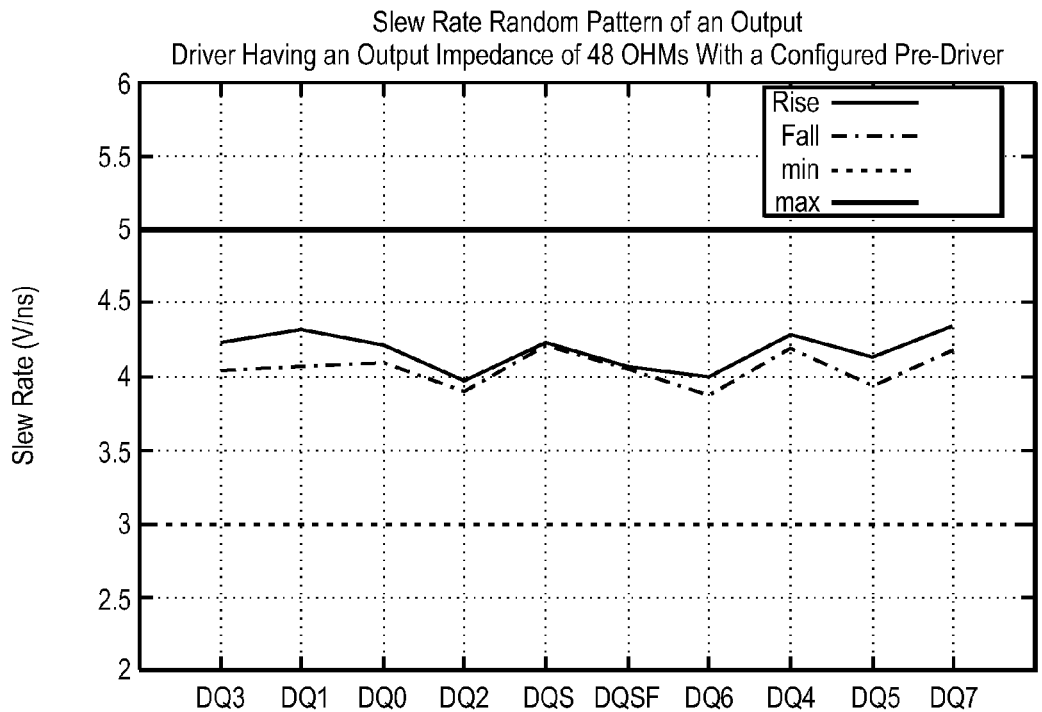

The simulated results of FIGS. 9A and 10A may be contrasted against the simulated results of a system employing the present embodiment (employing a configurable pre-driver circuit 132) that are illustrated in FIGS. 9B and 10B. For example, FIG. 9B illustrates simulated results of an output driver 60 set to a 40 ohm output impedance and employing a pre-driver circuit 132 that is configured to one of the plurality of states. In the simulated results of FIG. 9B, the slew rate is increased by approximately 1 V/ns over the simulated results illustrated in FIG. 9A. Similarly, FIG. 10B illustrates simulated results of an output driver 60 set to a 48 ohm output impedance and employing a pre-driver circuit 132 that is configured to one of the plurality of states. In the simulated results of FIG. 10B, the slew rate is increased by approximately 1 V/ns over the simulated results illustrated in FIG. 10A. More specifically, in FIG. 9B the average slew rate is approximately 4.4 V/ns at an output impedance of 40 ohms, and in FIG. 10B the average slew rate is approximately 4.25 V/ns at an output impedance of 48 ohms. In accordance with equation 1, the percentage difference between the slew rates at 34 ohms and 40 ohms is approximately 3% and the difference between the slew rates at 34 ohms and 48 ohms is approximately 6%. Accordingly, the simulated results illustrated in FIGS. 8-10B may confirm that the previously discussed techniques can be employed to maintain a generally constant slew rate of the output driver 60 (e.g., slew rates within 10% of one another) at various output impedances.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An output driver, comprising:
   a driver stage, wherein the driver stage can be configured to one of a plurality of output impedances; and
   a pre-driver circuit coupled the driver stage, wherein the pre-driver circuit can be configured based at least partially on the output impedance.

2. The output driver of claim 1, wherein the pre-driver circuit is configured to maintain a generally constant slew rate of the output driver regardless of the output impedance.

3. The output driver of claim 1, wherein the pre-driver circuit is configured to receive one or more control signals that configure the pre-driver to one or more states.

4. The output driver of claim 1, wherein the pre-driver circuit comprises a plurality of adjustable inverters coupled in parallel to an input of a pull-up and/or a pull-down leg of the driver stage of the driver.

5. The output driver of claim 1, wherein the pre-driver circuit modifies a pull-up and/or pull-down signal input to a trim transistor coupled to a gate of a pull-down and/or pull-up leg of the driver stage.

6. The output driver of claim 1, wherein the driver stage comprises a plurality of driver stages that can be enabled and/or disabled to set each of the plurality of output impedances.

7. An output driver system, comprising:
   a pre-driver configured to maintain a generally constant slew rate of an output driver across a plurality of output impedances.

8. The output driver system of claim 7, wherein the pre-driver comprises a circuit that is configurable to a plurality of states.

9. The output driver system of claim 8, wherein each of the states corresponds to at least one of the plurality of output impedances.

10. The output driver system of claim 7, wherein the pre-driver is selectable between states that respectively correspond to each of the plurality of output impedances.

11. A pre-driver circuit, comprising:
    an inverter;
    a first CMOS inverter;
    a second CMOS inverter; and
    a third CMOS inverter,
    wherein the inverter comprises an output coupled in parallel to the gates of the first CMOS inverter, the second CMOS inverter, and the third CMOS inverter, and an output of the pre-driver circuit is coupled in parallel to outputs of the first CMOS inverter, the second CMOS inverter, and the third CMOS inverter.

12. A memory device, comprising:
    an output driver having a configurable output driver strength and comprising:
    a plurality of driver stages arranged in parallel and wherein each of the plurality of driver stages comprises a respective pull-up leg and a respective pull-down leg, wherein each of the respective pull-up legs and each of the respective pull-down legs comprise a transistor and a fixed resistor; and a plurality of pre-drivers each having an output coupled to an input of at least a respective one of the transistors, wherein each of the plurality of pre-drivers comprises a configurable circuit comprising a plurality of control inputs configured to receive signals that are enabled or disabled based on the output driver strength, and wherein each of the plurality of pre-drivers is configured to maintain a generally constant slew rate of the output driver regardless of the output driver strength.

13. A method of operating a memory device, comprising:

determining an output driver strength of an output driver; and configuring a pre-driver based at least partially on the determined output driver strength.

14. The method of claim 13, wherein determining the output driver strength comprises determining an output impedance of the output driver.

15. The method of claim 13, wherein determining the output driver strength comprises determining a desired output impedance of the driver.

16. The method of claim 13, wherein determining the output driver strength comprises determining a selected output impedance of the driver.

17. The method of claim 13, wherein configuring comprises dynamically configuring.

18. The method of claim 13, wherein configuring comprises selectably configuring.

19. The method of claim 13, wherein configuring comprises adjusting.

20. The method of claim 13, wherein configuring the pre-driver based on the determined output strength comprises enabling and/or disabling one or more control signals based on the output driver strength.

21. The method of claim 20, wherein enabling and/or disabling one or more control signals configures one or more inverters of the pre-driver.

22. The method of claim 13, wherein configuring a pre-driver comprises configuring the pre-driver to output a modified pull-up and/or pull-down signal.

23. The method of claim 13, further comprising selecting a pre-driver configuration based on the output driver strength.

24. The method of claim 23, wherein the pre-driver configuration comprises a predetermined configuration associated with the output driver strength.

25. The method of claim 23, wherein selecting comprises retrieving form a storage location.

* * * * *